United States Patent [19]
Heo et al.

[11] Patent Number: 6,055,657
[45] Date of Patent: Apr. 25, 2000

[54] TEST BOARD FOR TESTING IC DEVICES OPERATING IN MERGED DATA OUTPUT MODE OR STANDARD MODE

[75] Inventors: Kyeong II Heo; Young Kee Park, both of Asan, Rep. of Korea

[73] Assignee: Samsung Electronics Co., Ltd., Suwon, Rep. of Korea

[21] Appl. No.: 08/967,016

[22] Filed: Nov. 10, 1997

[30] Foreign Application Priority Data

Jul. 11, 1997 [KR] Rep. of Korea ................. 97-32280

[51] Int. Cl.[7] .................................................. G01R 31/28
[52] U.S. Cl. ........................................................ 714/724
[58] Field of Search ........................... 714/724, 726, 714/729; 324/73; 326/16

[56] References Cited

U.S. PATENT DOCUMENTS

| | | | |
|---|---|---|---|
| 5,568,492 | 10/1996 | Flint et al. ............................. | 714/724 |
| 5,673,270 | 9/1997 | Tsujimoto ............................... | 714/718 |
| 5,717,652 | 2/1998 | Ooishi ................................... | 365/233 |
| 5,754,559 | 5/1998 | Nevill .................................... | 714/724 |
| 5,794,175 | 8/1998 | Conner .................................. | 702/119 |

*Primary Examiner*—Albert De Cady
*Assistant Examiner*—Shelly A Chase
*Attorney, Agent, or Firm*—Jones Volentine, L.L.P.

[57] ABSTRACT

During burn-in testing of IC devices, the devices operate in either merged data output mode for shortening the test time or in standard mode for detecting defective data output terminals of the devices. A single test board is provided to test the devices regardless of the operational mode. The test board wiring patterns electrically connect a predetermined number of merged data output terminals of the device to the I/O pins of the test board when the devices are in the merged data output mode. When the devices operate in the standard mode, the wiring patterns electrically connect all the output terminals of the devices to the I/O pins.

18 Claims, 5 Drawing Sheets

TEST BOARD FOR TESTING IC DEVICES OPERATING IN MERGED DATA OUTPUT MODE OR STANDARD MODE

BACKGROUND OF THE INVENTION

1. Field of the Invention

The present invention generally relates to the testing of integrated circuit (IC) devices, and more particularly, to a test board which can test the IC devices operating in either a merged data output mode or a normal standard mode using just one test board.

2. Description of the Related Art

The testing process for IC devices, particularly for memory devices, includes an electrical die sorting (EDS) test, a burn-in test, a reliability test, a final test, and a quality assurance (Q/A) test. The EDS test detects defective elements (chips) on a wafer before the semiconductor assembly processes start. The burn-in test is performed to screen out substandard devices by environmentally (thermally and/or electrically) stressing the packaged devices to accelerate any failures or defects resident in the device. The reliability tests, such as temperature cycling tests (T/C) and pressure cooker tests (PCT), confirm that the IC devices delivered to users are reliable. During the final test all of the DC and AC parameters are checked to confirm that the IC devices achieve the designed performance and functions. The Q/A test is performed on certain of the IC devices that have passed the final test to confirm that the results of the final test are correct.

During the burn-in test, for example, the acceleration of early failures is achieved by thermally and electrically stressing the devices, accompanied by a functional test that measures output signals from the devices. Once the devices are loaded into a test system or test board, they can be exercised or tested under a variety of stresses, whereby their proper function and operation can be verified without removing them from the burn-in test board.

The burn-in test uses test boards where many (e.g., 128) IC devices to be tested are mounted. The test board is then inserted into an oven or a chamber which comprises a temperature controller for subjecting the devices to an increased temperature condition for accelerating their early failure.

For electrically stressing the devices, terminals of the devices are connected in parallel to signal supply pins of a test system, where increased voltage and high current are supplied to the devices. The thermal and electrical stress applications can be performed at one time on all the devices mounted on the test board, even when the number of the input/output (I/O) pins of the test system is limited. However, when performing the functional test portion of the monitor burn-in, the different I/O pins of the test system must be connected to the output terminals of the devices. Accordingly, the burn-in system uses scanning signals for selecting particular devices mounted on the test board, but in the conventional system only one or two devices are selected at the same time by the scanning signals.

The specific number of devices selected is determined by the number of data bits of the output signals from the device and total data input pins of the test system. For example, if the number of data input pins is 'm' and the output signals have 'a' bits, the maximum number of the selected devices would be 'b', with the relationship m=a×b or b=m/a. If only a small number of devices are selected at one time for functional testing, the testing process time increases and the efficiency of the burn-in test decreases.

During the functional testing portion of the burn-in test, after repeatedly writing data according to predetermined test patterns into the memory device, the burn-in tester reads out data from the memory devices via data output terminals (hereinafter referred to as 'DQ' terminals). If the data as read from the device is different from the written data, the burn-in tester considers that the device has failed.

For reading data from the memory devices under test, each of I/O pins of a test board on which the devices are mounted must be connected to each of the DQ terminals of the devices. Therefore, when the tester and the test board have a small number of pins, it takes a long time to read out data from the devices mounted on the test board and to test all of the devices.

In order to shorten the testing time, a so-called merged data output test method has been developed. In the merged data output mode, the device delivers its multiple output data through either one or two predetermined DQ terminals, which function as the merged data output terminal or terminals. After writing n-bits of data into the device having n DQ terminals, in which each bit is the same, the tester reads the output data via the merged data output terminal or terminals. If the device has no defective cell, the merged output data will be, e.g., logic '1', and if the device has a defective cell, the merged output data will be, e.g., logic '0'. Thus, the test can detect that the device under test is acceptable or unacceptable.

However, in the merged data output test method, it is impossible to detect which of the n DQ terminals delivered the false output data. This causes a problem when acceptable module devices are to constructed using the partially defective devices. For example, if a memory device having 8 DQ terminals is found to have just one defective DQ terminal, e.g., DQ 0, this partially defective memory device can be used later to construct a good memory module device. In order to accomplish this, however, it is necessary to know the specific DQ terminal that produced the erroneous data output. Also, in some cases, customers buy these partially defective memory devices at a very steep discount, but they still need to know which specific DQ terminal has failed.

In order to ascertain this failed DQ terminal information, an additional test board and test procedure must be used to detect which DQ terminals deliver the false data. As a result, the cost for the test boards and the required testing time increases.

SUMMARY OF THE INVENTION

It is an object of the present invention to provide a single test board which can test IC devices operating in either merged data output mode or standard mode.

It is another object of the present invention to reduce the cost and testing time for preparing the test board.

A test board of the present invention includes mode selection signal terminals, conductive wiring patterns, and scan signal terminals. Through the mode selection signal terminal, a burn-in tester provides a mode selection signal to the devices under test, which determines the operational mode (either a merged data output mode or a standard mode) of the devices. When the devices are operated in the merged data output mode, the wiring patterns electrically connect a predetermined number of merged data output terminals of the DQ terminals of the devices to the I/O pins of the test board. When the devices are operated in the standard mode, the wiring patterns electrically connect all the DQ terminals of the devices to the I/O pins. The scan signal is used to selectively enable the devices mounted into sockets of the test board.

When the sockets of the test board are arranged in a matrix form, the scan signal terminal supplies row scan signals, for enabling the devices arranged along the selected row of the matrix, and column scan signals, for enabling the devices arranged along the selected column of the matrix.

BRIEF DESCRIPTION OF THE DRAWINGS

The above objects and advantages of the present invention are described further below, with reference to the accompanying drawings in which.

DETAILED DESCRIPTION OF THE PREFERRED EMBODIMENT

Figure 1:
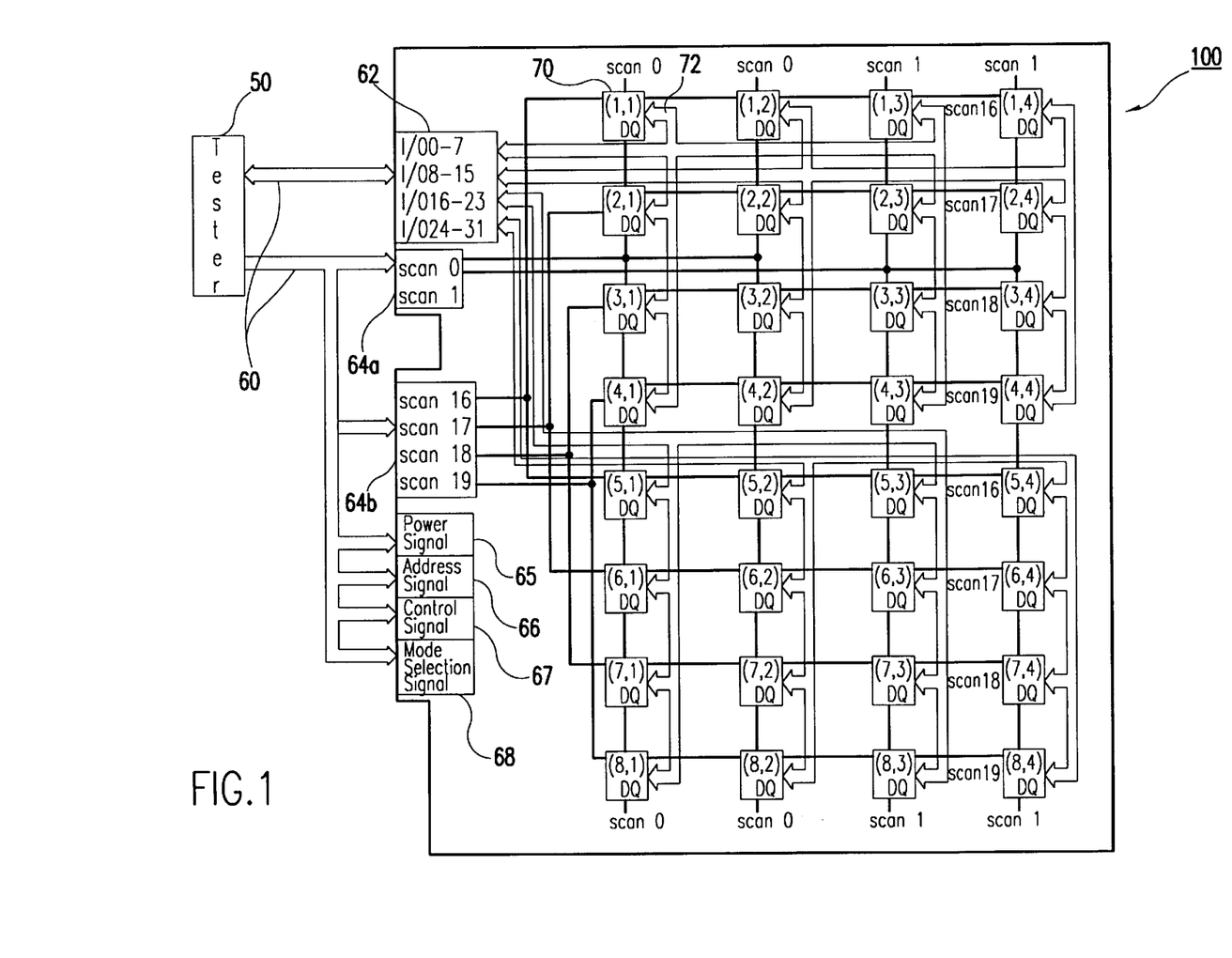
FIG. 1 is a schematic circuit diagram of a test board according to the present invention.

FIG. 1 illustrates an exemplary test board of the present invention. The test board 100 has a plurality of, e.g., thirty-two sockets into which IC devices 70 to be tested are inserted. Each of the devices 70 has eight data output or DQ terminals, and, in this embodiment, there are thirty-two I/O pins 62 for the test board 100. Scan signals 0, 1, and 16–19 selectively enable the devices 70 via a plurality of wiring patterns 72. I/O pins 62, the scan signals 64a, 64b, power signal 65, address signals 66, control signals 67, and mode selection signal 68 are electrically interconnected to a tester 50 via cable 60, so that the tester 50 can supply the necessary electrical signals for testing to the devices 70 and can measure the output signals from the devices 70. Such an exemplary tester 50 is described at U.S. patent application Ser. No. 08/966,532, filed Nov. 10, 1997, entitled "TEST SYSTEM FOR VARIABLE SELECTION OF IC DEVICES FOR TESTING" which is hereby incorporated by reference in its entirety.

The power supply signal 65, the address signal 66, the control signal 67, and the mode selection signal 68 are all connected to each of the thirty-two devices 70, but the connections are not shown in FIG. 1 for simplicity. The control signal 67 controls the operation of the device and comprises RAS (Row Address Strobe), CAS (Column Address Strobe), WE (Write Enable), and OE (Output Enable) control signals. The mode selection signal 68 is used to select whether the memory device 70 operates in the standard mode or in the merged data output mode.

The operational modes of the devices are determined by the test system 50. In the merged data output mode, the device 70 outputs its 8 bit output data through certain merged data output terminals, for example, through DQ0 and DQ7. For instance, if the device is an 8M by 8 (64M) memory device, in which one bit data is output from each of the 8M memory blocks, the two most significant bits, e.g., Y11 and Y12, of the address signals are not considered in the merged data output. Accordingly, four 8M memory blocks having the same address bits (e.g., X0–X12 and Y0–Y10) except the most significant bits (e.g., Y11 and Y12) provide their 4 bit output data via one of the merged data output terminals (DQ0 or DQ7). For example, when data '1' is written to all of the memory cells and then data is read from the memory cells, the correct data '1' is output from the DQ0 terminal only when four data bits from the memory cells in the four 8M memory blocks all have data '1' values. If at least one 8M memory block has a defective cell such that the data output has a false '0' value, output data from the DQ0 terminal will be '0', which signifies that the memory device has a defect.

The scanning signal 'scan 0' (64a) enables memory devices in the first and the second columns of the test board 100 and the scanning signal 'scan 1' (64a) enables memory devices in the third and the fourth columns of the thirty two memory devices 70 arranged in the matrix form. Meanwhile, the row enable scanning signals 'scan 16, scan 17, scan 18, and scan 19' (64b) enable the memory devices 70 located, respectively, in the first/fifth rows, second/sixth rows, third/seventh rows, and fourth/eighth rows. When both the row scanning signals 64a and the column scanning signals 64b are active, the device 70 at the intersection produces output data. For example, if the 'scan 0' signal of the column scanning signals 64a and the 'scan 16' signal of the row scanning signals 64b are active, output data can be read through the DQ terminal coming from the devices (1,1), (1,2), (5,1), and (5,2). Different scanning signals may be allocated to chose specific columns and rows for outputting data. In general, however, if the scanning signals are 32 bits, scan 0 to 15 are used for column selection and scan 16 to 31 are used for row selection.

The 32 I/O pins 62 of the test board 100 are electrically connected to the DQ terminals of the devices by a wiring pattern 72. The wiring pattern 72 must be designed such that the output data coming from different devices do not conflict when delivered to the I/O pins 62. For example, in FIG. 1, I/O pins numbered 0–7 are connected to the devices (1,1), (2,1), (3,1), (4,1), (1,3), (2,3), (3,3), and (4,3), I/O pins 8–15 are connected to the devices (1,2), (2,2), (3,2), (4,2), (1,4), (2,4), (3,4), and (4,4), I/O pins 16–23 are connected to the devices (5,1), (6,1), (7,1), (8,1), (5,3), (6,3), (7,3), and (8,3), and I/O pins 24–31 are connected to the devices (5,2), (6,2), (7,2), (8,2), (5,4), (6,4), (7,4), and (8,4). This single test board 100 can test both the merged data output mode operation and the standard mode of operation.

Figure 2:
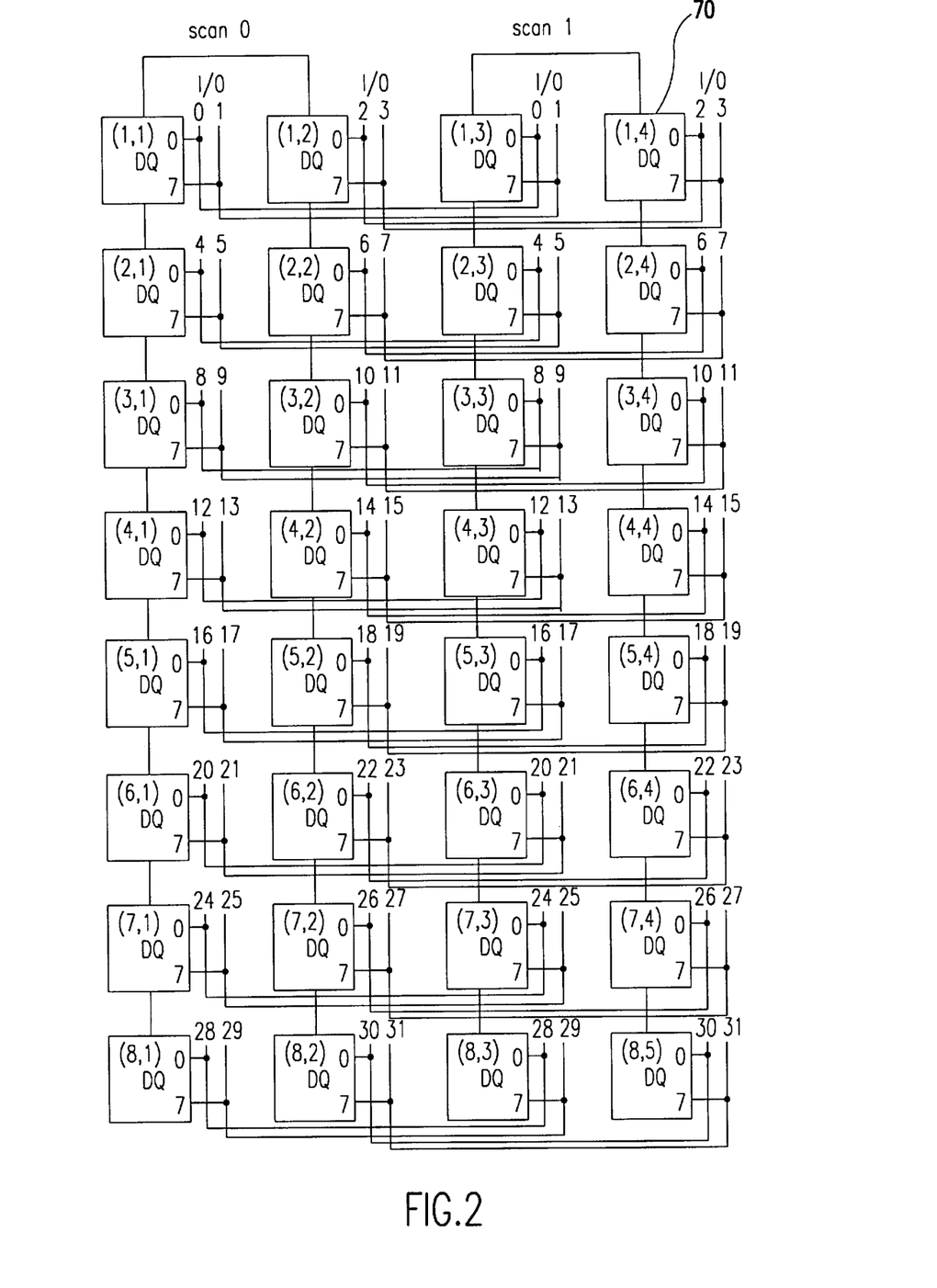
FIG. 2 is a partial schematic diagram of a test board of the present invention showing the relationship between device selection and output data when IC devices under test operate in the merged data output mode.

FIG. 2 illustrates a partial schematic diagram of a test board for testing devices that are operating in the merged data output mode. When the mode selection signal 68 from the controller of the tester 50 goes active, the devices mounted in the sockets of the test board enter into the merged data output mode.

The testing operation of FIG. 2 will be described, for example, using an 8M by 8 (64M) DRAM device, where each of the memory devices delivers its 8-bit output data through the merged data output terminals DQ 0 and DQ 7. Generally, the scanning signals are in their active states when they have a logic '1' value, while the scanning signals are inactive when they are logically '0'. Therefore, if, e.g., the scan 0 signal is '1', devices located in the first and the second columns can be selected.

Recall that two bits of data are output from terminals DQ0 and DQ7 of each device in the merged data output mode. Since there are thirty two I/O pins 62 of the test board 100, sixteen devices can be selected by the scanning signals at one time in this merged data output mode. This general relationship can be stated by the formula $d=(m/p)$, where 'd' is the number of devices that can be selected for testing at one time, 'm' is the number of I/O pins 62 of the test board 100 and 'p' is the number of merged data output terminals of the device. Note that the variable 'p' is less than a variable 'n', which is the number of data output terminals of the device.

The output data from all thirty-two devices can be checked by alternately activating the scan 0 and scan 1 signals while maintaining the scan 16 to scan 19 signals in an active state. More specifically, the column scan signals (64a) 'scan 0' and 'scan 1' are alternately used to select memory devices (1,1)–(8,2) and (1,3)–(8,4), respectively, while maintaining the row scan signals (64b) scan 16 to scan 19 in their active states.

Referring to FIG. 1 and FIG. 2, the connections between the DQ terminals of the memory devices 70 and the I/O pins 62 of the test board 100 are configured such that the devices 70 enabled by the 'scan 0' signal are connected, one by one, to the I/O pins 0 to 31, and the devices 70 enabled by the 'scan 1' signal are connected, one by one, to the I/O pins 0 to 31. When a high voltage signal is applied to the 'scan 0' signal and a low voltage signal is supplied to the 'scan 1' signal, the devices resident in the columns (1,1)–(8,1) and (2,1)–(8,2) are enabled, while the devices resident in the columns (1,3)–(8,3) and (1,4)–(8,4) are disabled. After writing identical data, e.g., data 1, into the sixteen enabled memory devices, the tester reads output data coming through the merged data output terminals DQ 0 and DQ 7 of each enabled device 70 and arriving at I/O pins 0 to 31. The tester measures these output data and determines which devices are defective. If, for example, false data '0' is detected from the I/O pins 13 and 27, the tester determines that the devices (4,1) and (7,2) are failed. Another sixteen memory devices can be tested by making the 'scan 0' signal inactive and the 'scan 1' signal active, and then writing data into the selected devices and reading and measuring the output data in the same manner as just described.

As is evident, in the merged data output mode test, several memory devices are tested at one time, thereby greatly reducing the testing time. However, this testing process suffers a drawback in that it is impossible to detect which of the eight DQ terminals of the specific device, for example, devices (4,1) and (7,2), delivered the false output data.

Figure 3:
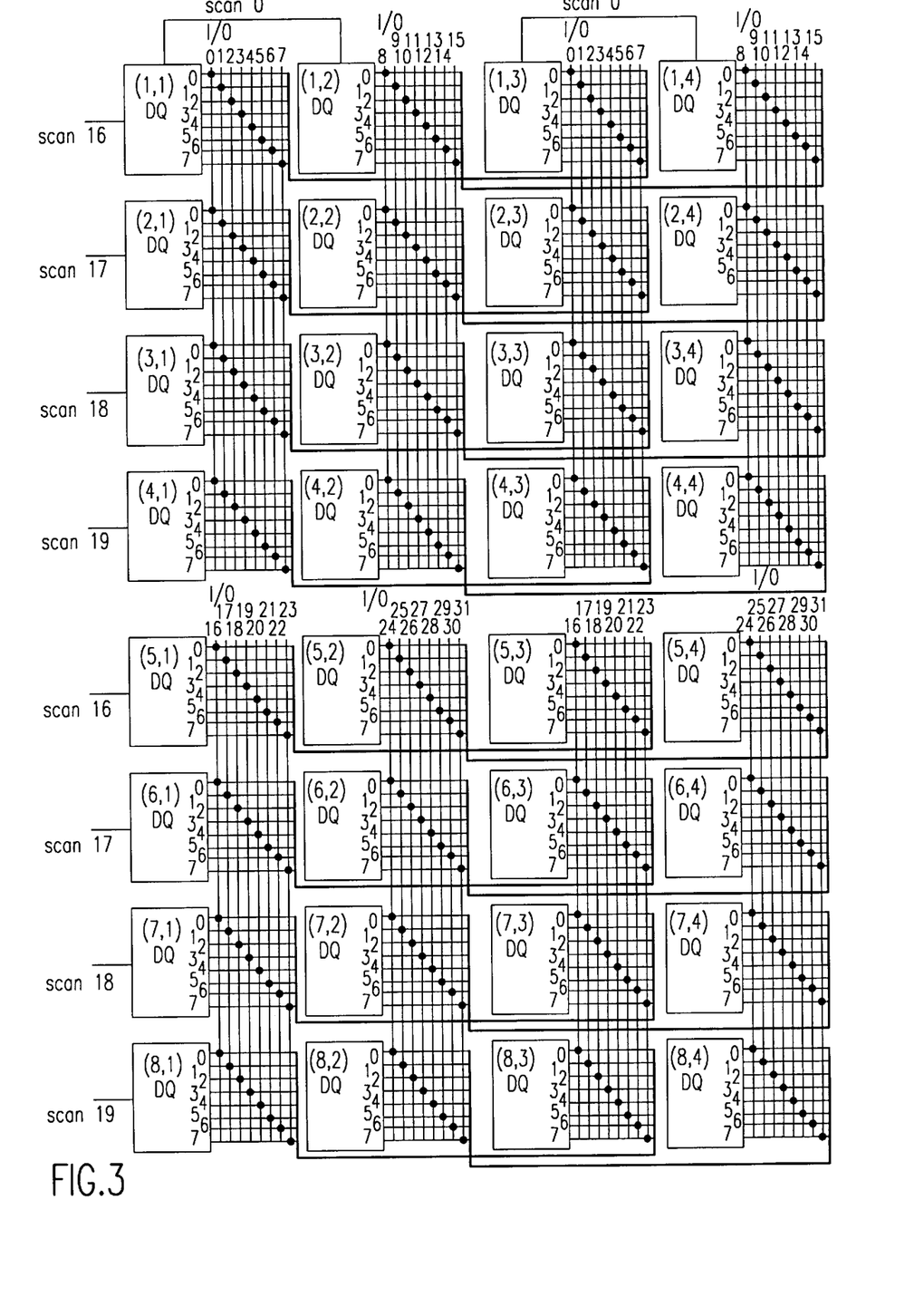
FIG. 3 is a partial schematic diagram of a test board of the present invention showing the relationship between device selection and output data when the IC devices under test operate in the standard mode.

FIG. 3 shows a partial circuit diagram of the test board for testing devices operating in the standard mode. When the merged data output mode test identifies a memory device with a defective cell, this defective device is then subjected to further testing to specifically detect which of the DQ terminals is outputting the false output data without changing the test board. To accomplish this subsequent test, the memory device must operate in the standard mode. As described above, if the defect is only partial and most of the DQ terminals still deliver the correct output data, this partially defective device can be used later to construct acceptable modules.

To detect the defective DQ terminals, the mode selection signal 68 goes low to cancel the merged data output mode, and the DQ terminals from DQ 0 to DQ 7 are then electrically connected, one by one, to the I/O pins 62. When a test board having thirty-two I/O pins is used, four partially defective memory devices, each having eight DQ terminals, can be tested at one time.

During the testing of the partially defective memory device, the column scan signal 64a and the row scan signal 64b are patterned to selectively enable the memory devices. For instance, when the scan 0 and the scan 16 signals are made high and the other scan signals made low, devices (1,1), (1,2) and (5,1), (5,2) are enabled, so that the output data from these devices can be read via the I/O pins 0–7, 8–15, 16–23, and 24–31, respectively. Next, by making the scan 16 signal low and the scan 0 and 17 signals high, the devices (2,1), (2,2) and (6,1), (6,2) are enabled and tested. In this manner, the thirty-two memory devices are sequentially tested.

After the test, the partially defective memory devices are sorted depending on the defect types. They can then be salvaged to construct an acceptable memory module, or they can be sold to a customer with the specific defect data being disclosed.

Therefore, with this single test board 100 both the merged data output mode operation and the standard mode of operation can be tested. Table 1 below shows the exemplary patterns of the device selection signals, i.e., the scanning signal patterns for the test.

TABLE 1

Device Selection Signal Patterns

Device Selection Signal (Scanning Signal)

| | 0 | 1 | 16 | 17 | 18 | 19 | Operation Mode | Selected Devices |
|---|---|---|---|---|---|---|---|---|
| Pattern 1 | 1 | 0 | 1 | 1 | 1 | 1 | Merged DQ | (1,1)-(8,1) (1,2)-(8,2) |
| Pattern 2 | 0 | 1 | 1 | 1 | 1 | 1 | Merged DQ | (1,3)-(8,3) (1,4)-(8,4) |
| Pattern 3 | 1 | 0 | 1 | 0 | 0 | 0 | Standard | (1,1) (1,2) (5,1) (5,2) |
| Pattern 4 | 1 | 0 | 0 | 1 | 0 | 0 | Standard | (2,1) (2,2) (6,1) (6,2) |
| Pattern 5 | 1 | 0 | 0 | 0 | 1 | 0 | Standard | (3,1) (3,2) (7,1) (7,2) |
| Pattern 6 | 1 | 0 | 0 | 0 | 0 | 1 | Standard | (4,1) (4,2) (8,1) (8,2) |
| Pattern 7 | 0 | 1 | 1 | 0 | 0 | 0 | Standard | (1,3) (1,4) (5,3) (5,4) |
| Pattern 8 | 0 | 1 | 0 | 1 | 0 | 0 | Standard | (2,3) (2,4) (6,3) (6,4) |
| Pattern 9 | 0 | 1 | 0 | 0 | 1 | 0 | Standard | (3,3) (3,4) (7,3) (7,4) |
| Pattern 10 | 0 | 1 | 0 | 0 | 0 | 1 | Standard | (4,3) (4,4) (8,3) (8,4) |

In Table 1, the scanning signals are in their active states when they have a logic '1' value, while the scanning signals are inactive when they are logically '0'. Therefore, if, e.g., the scan 0 signal is '1', devices located in the first and the second columns can be selected.

As described previously, two bits of data are output from terminals DQ0 and DQ7 of each device in the merged data output mode. Since there are thirty two I/O pins 62 of the test board 100, sixteen devices can be selected by the scanning signals at one time in this merged data output mode. Therefore, the output data from all thirty-two devices can be checked by alternately activating the scan 0 and scan 1 signals while maintaining the scan 16 to scan 19 signals in an active state, as shown in Patterns 1 and 2 of Table 1.

On the other hand, since 8 bits of data are output from terminals DQ0 through DQ7 of each device in the standard mode, four devices can be selected by the scanning signals at one time using thirty two I/O pins 62. Accordingly, as shown by Patterns 3 to 10 of Table 1, it is possible to check the output data of all thirty-two devices by alternately making one of the scan 0 and scan 1 signals active, and then sequentially activating each one of the scan 16 to scan 19 signals. By using these scanning patterns, the failure of a specific device can be traced using the data from the output terminal.

Figure 4A:
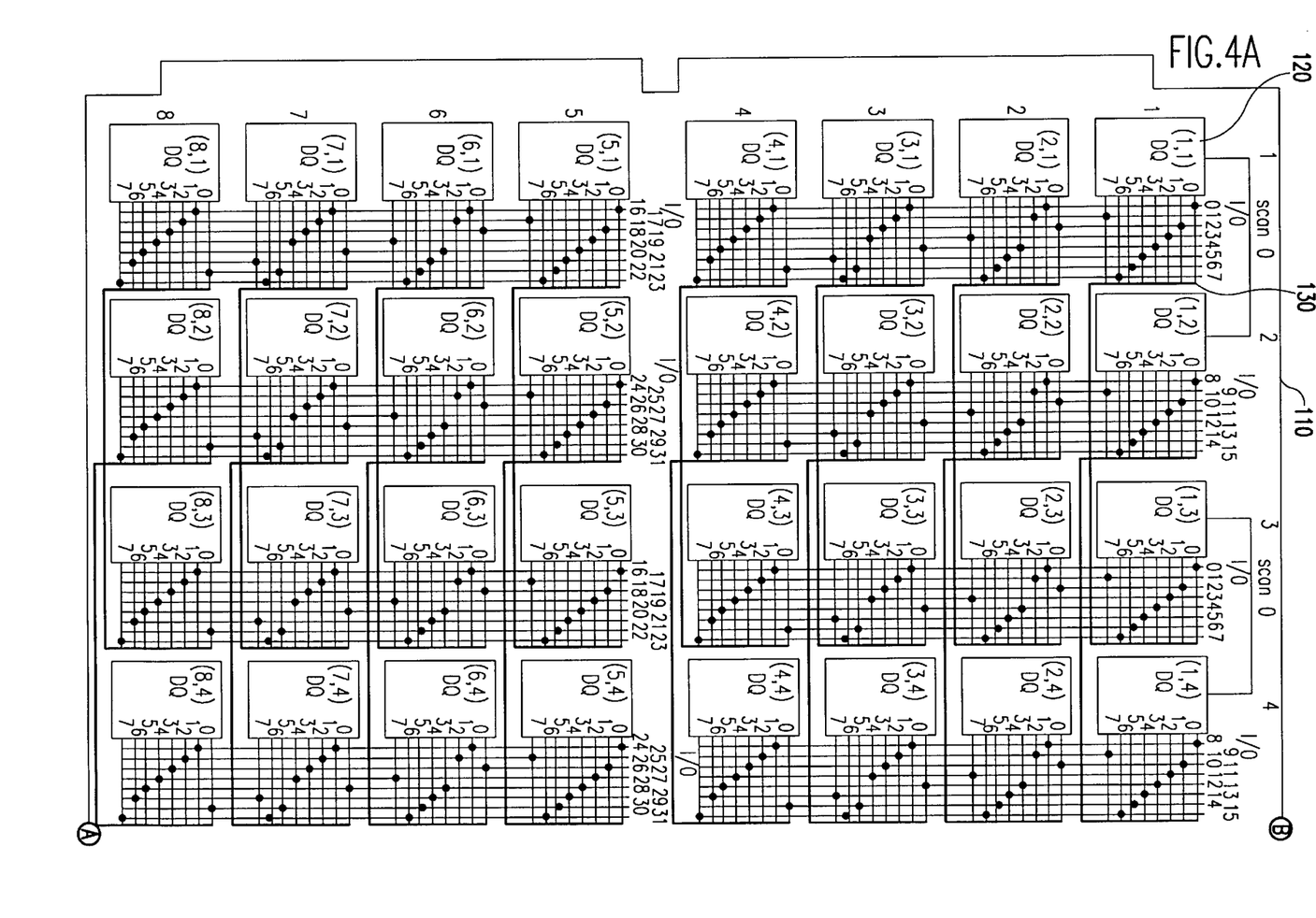
FIG. 4 is a schematic diagram of a test board according to an embodiment of the present invention.
Figure 4B:
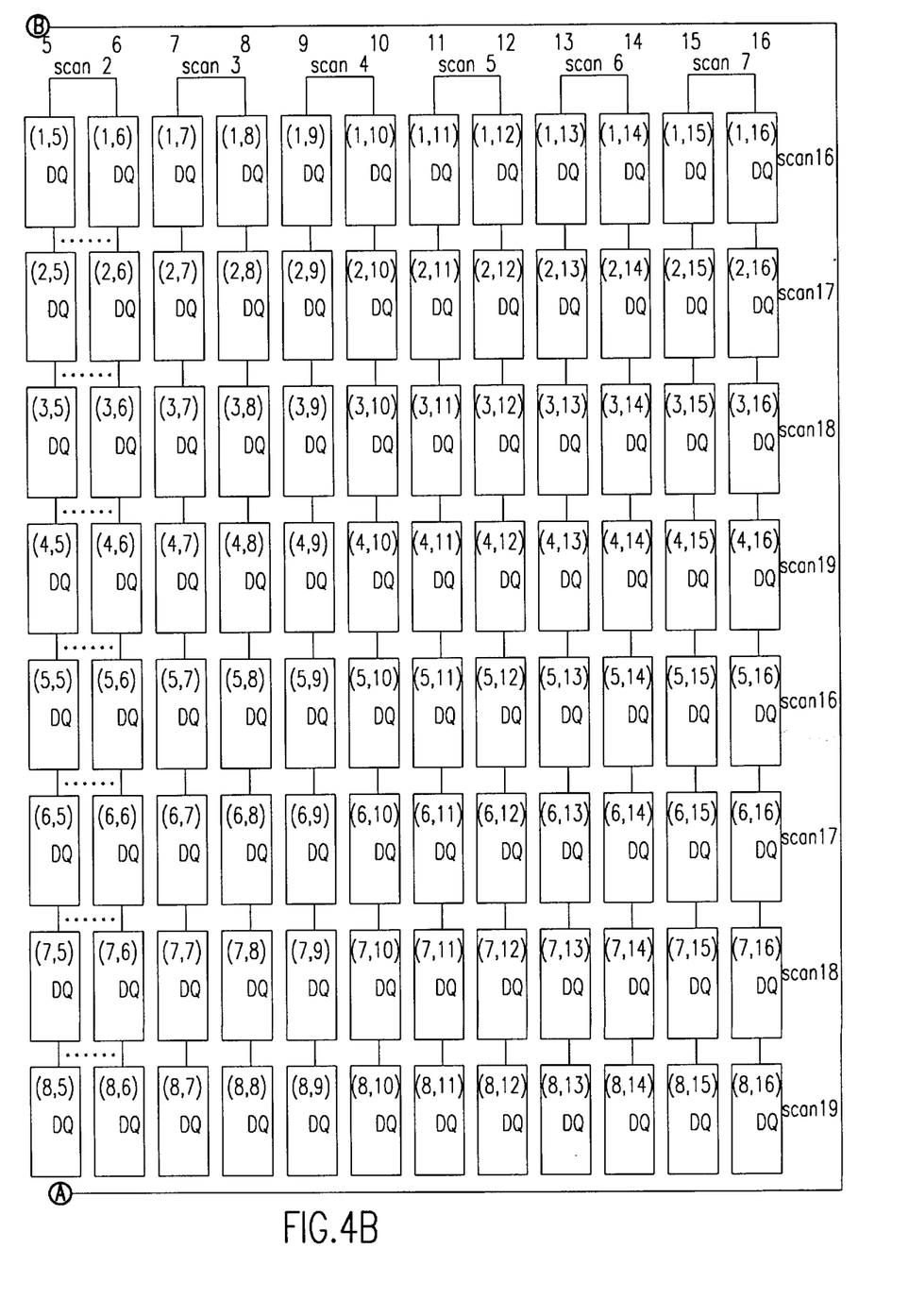

FIG. 4 is an exemplary test board 110 for showing the connections between the DQ terminals of the devices 120 and the I/O pins 62 of the test board. The test board 110 has, e.g., 128 sockets into which IC devices 120 to be tested are inserted. For simplicity, only the detailed connections in the four columns to the left are shown in FIG. 4.

When the memory devices 120 are tested by the merged data output scheme, the scan 16–19 signals remain in the active high state and the column scan 0–7 signals are sequentially activated. If the scan 0 signal is active, the thirty-two packets of output data coming through the merged data output terminals DQ 0 and DQ 7 of the sixteen devices (1,1) to (8,2) are delivered to the thirty-two I/O pins. When the scan 0 is made inactive and the scan 1 signal goes high, another sixteen devices at the third and the fourth columns can provide output data to the I/O pins. By controlling the column scan signals in this manner, output data from all of the 128 memory devices can be measured and the failed devices can be detected.

The control of the pattern of the scan signals is determined in accordance with the conductive wiring patterns 130. For example, if there is only one merged data output terminal of each memory device, e.g., DQ 0, the wiring patterns 130 must be changed so that DQ 0 of the device (1,1) is connected to the I/O 0, and the DQ 0 of the device (1,3) is connected to the I/O 1, and so on. In this case, therefore, two of the column scan signals scan 0 to scan 7 are enabled at one time to test the devices.

In order to detect which DQ terminal is outputting the false data, the memory devices which are found to have defective cells by the merged data output mode test are inserted to the sockets of the test board, and the memory device operates in its standard mode so that the output data can appear on all of its DQ terminals. Then, by controlling the pattern of the column and the row scan signals, the DQ terminals are connected to the I/O pins one by one.

For example, with the wiring patterns as shown in FIG. 4, the output data from the devices (1,1), (1,2) and (5,1), (5,2) are delivered to the thirty-two I/O pins without collision by making the scan 0 and the scan 16 signals active. Thereafter, the scan 0 and the scan 17 go high and the devices (2,1), (2,2) and (6,1), (6,2) deliver their output data to the I/O pins.

With the test board of the present invention, therefore, it is possible to test memory devices operating in either the merged data output mode and the standard mode, without changing the test board.

It will be appreciated that various modifications and alterations might be made by those skilled in the art without departing from the spirit and scope of the present invention. In particular, one skilled in the art will recognize that the wiring patterns of the test board can be modified depending on the number of DQ terminals used as the merged data output terminal and the number of the I/O pins and DQ terminals. It is therefore intended that the appended claims encompass any such modifications or embodiments.

What is claimed is:

1. A test board connected to a tester for testing a plurality of integrated circuit (IC) devices, each IC device having a plurality of output terminals, the terminals comprising at least one merged data output terminal, the test board comprising:

a plurality of sockets to which the corresponding plurality of IC devices are inserted;

a plurality of input/output (I/O) pins connected to the tester;

mode selection signal pins connected to the tester for selecting an operational mode of the IC devices, the operation mode being one of a merged data output test mode and a standard test mode;

control signal pins connected to the tester for controlling functions of the IC devices;

wiring patterns for electrically connecting the output terminals of each of the IC devices and the I/O pins, wherein the at least one merged data output terminal of the IC device containing merged output data of the IC device is sequentially connected to the I/O pins when the IC devices are operated in the merged data output test mode, and wherein the output data terminals containing standard output data of the IC devices are sequentially connected to the I/O pins when the IC devices are operated in the standard test mode; and scan signal pins connected to the tester for selectively enabling the IC devices inserted in the sockets.

2. The test board of claim 1, wherein the plurality of sockets containing the IC devices are arranged in a row and column matrix, and wherein an IC device is enabled when corresponding row selection signals and column selection signals are in active states.

3. The test board of claim 2, wherein the number of IC devices simultaneously enabled by the row selection signals and the column selection signals in the standard test mode is determined by a formula (m/n), where 'm' is a number of I/O pins of the test board and 'n' is a number of data output terminals.

4. The test board of claim 2, wherein the number of IC devices simultaneously enabled by the row selection signals and the column selection signals in the merged data output test mode is determined by a formula (m/p), where 'm' is a number of I/O pins of the test board and 'p' is a number of merged data output terminals.

5. The test board of claim 4, wherein 'n' is a number of data output terminals and 'n' is greater than 'p'.

6. The test board of claim 3, wherein the I/O pins of the test board are connected to the 'n' number of data output terminals via the wiring pattern.

7. The test board of claim 4, wherein the I/O pins of the test board are connected to the 'p' number of merged data output terminals via the wiring pattern.

8. The test board of claim 2, wherein the column selection signals are alternatively activated and deactivated while the row selection signals are maintained in an active state when the test system operates in the merged data output test mode.

9. The test board of claim 2, wherein each column selection signal is maintained in an active state while the row selection signals are sequentially activated and deactivated when the test system operates in the standard test mode.

10. The test board of claim 1, wherein the IC devices are memory devices, and the test board further comprises address signal pins for providing address signals to the memory devices.

11. The test board of claim 1, further comprising a detector which detects whether an IC device has failed a test of the merged output data test mode and when the IC device has failed the test, switching the test board to the standard test mode for that IC device.

12. A method of testing a plurality of integrated circuit (IC) devices, each IC device having a plurality of output terminals, the terminals comprising at least one merged data output terminal, comprising:

inserting a plurality of IC devices into a corresponding plurality of sockets;

connecting a plurality of input/output (I/O) pins to a tester;

selecting an operational test mode of the IC devices, the operation test mode being one of a merged data output test mode and a standard test mode;

when the IC devices are operated in the merged data output test mode, electrically connecting the output terminals of each of the IC devices and the I/O pins, wherein the at least one merged data output terminal of the IC device containing merged output data of the IC device is sequentially connected to the I/O pins;

when the IC devices are operated in the standard test mode, sequentially connecting the output data terminals containing standard output data of the IC devices to the I/O pins; and selectively enabling the IC devices inserted in the sockets.

13. The method of claim 12, further comprising detecting whether an IC device has failed a test of the merged output data test mode and when the IC device has failed the test, switching the test board to the standard test mode for that IC device.

14. The method of claim 12, further comprising arranging the plurality of sockets containing the IC devices in a row and column matrix, and enabling an IC device when corresponding row selection signals and column selection signals are in active states.

15. The method of claim 14, further comprising determining a number of IC devices simultaneously enabled by the row selection signals and the column selection signals in the standard test mode by a formula (m/n), where 'm' is a number of I/O pins of the test board and 'n' is a number of data output terminals.

16. The method of claim 14, further comprising determining a number of IC devices simultaneously enabled by the row selection signals and the column selection signals in the standard test mode by a formula (m/n), where 'm' is a number of I/O pins of the test board and 'n' is a number of data output terminals.

17. The method of claim 14, further comprising alternatively activating and deactivating the column selection signals while the row selection signals are maintained in an active state when the test system operates in the merged data output test mode.

18. The method of claim 14, further comprising maintaining each column selection signal in an active state while sequentially activating and deactivating the row selection signals when the test system operates in the standard test mode.

* * * * *